MULTILEAD PACKAGE FOR A MULTILEAD ELECTRICAL DEVICE

Filed July 29, 1966 4 Sheets-Sheet 1

INVENTORS:
JACK S. KILBY
HAROLD D. TOOMBS
JAMES H. VAN TASSEL

E. Mickey Hubbard
ATTORNEY

Dec. 16, 1969 J. S. KILBY ET AL 3,484,534

MULTILEAD PACKAGE FOR A MULTILEAD ELECTRICAL DEVICE

Filed July 29, 1966 4 Sheets-Sheet 2

Dec. 16, 1969 J. S. KILBY ET AL 3,484,534

MULTILEAD PACKAGE FOR A MULTILEAD ELECTRICAL DEVICE

Filed July 29, 1966 4 Sheets-Sheet 4

INVENTORS:
JACK S. KILBY
HAROLD D. TOOMBS
JAMES H. VAN TASSEL

E. Mickey Hubbard
ATTORNEY

United States Patent Office 3,484,534
Patented Dec. 16, 1969

3,484,534

MULTILEAD PACKAGE FOR A MULTILEAD ELECTRICAL DEVICE

Jack S. Kilby, Dallas, Harold D. Toombs, Richardson, and James H. Van Tassel, Dallas, Tex., assignors to Texas Instruments Incorporated, Dallas, Tex., a corporation of Delaware Filed July 29, 1966, Ser. No. 568,799
Int. Cl. H05k *5/06*
U.S. Cl. 174—52 8 Claims

ABSTRACT OF THE DISCLOSURE

Disclosed is a method of packaging multilead semiconductor devices and the resulting product. A layer of conductive metal is bonded to a sheet of dielectric material containing a cavity. The conductive layer is masked and etched to form individual strip leads which adhere to the dielectric sheet and extend out into the cavity. A multilead semiconductor device is then located in the cavity with its contacts bonded to the strip leads extending from the dielectric sheet. Also disclosed is a multilead package for a multilead electrical device that includes a support member with at least one opening in it and a plurality of conductive ribbons formed on one surface of the support member. Each of the conductive ribbons has one end that extends into the opening and another end that terminates in close proximity to the periphery of the support member.

This invention relates generally to semiconductor devices, and more particularly relates to a process for packaging semiconductor devices having a large number of external leads, and to the product manufactured by the process.

In an integrated circuit, a number of active semiconductor devices are formed on a chip of silicon and interconnected in place by thin film leads to form a complete circuit. Logic gates and flip-flop circuits having ten to fourteen leads have been extensively manufactured and sold. As integrated circuit technology has advanced over the past several years, yields have increased to the point that large arrays of the logic circuits can be produced on a single semiconductor slice nominally one and one-eighth inches in diameter. Second and third level interconnections can then be used to interconnect the individual circuits as desired and provide bonding pads at the edge of the slice. However, these circuit arrays usually require a large number of external connections, typically about one hundred and fifty. Conventional multilead packaging methods and devices are definitely limited as to the number of external leads that are practical both during fabrication of the devices and during subsequent use of the devices by the ultimate consumer. For example, the standard flat pack generally has from ten to twenty leads, which are commonly referred to as pins, and the packages which utilize a ceramic substrate upon which a number of individual integrated circuit chips are mounted is usually limited to twenty or thirty pins, with forty being a maximum as a practical matter. In addition, the standard packaging techniques require ball bonded lead wires to interconnect the bonding pads formed on the surface of the monolithic semiconductor body. This is not only an expensive procedure, but results in two impedance discontinuities which degrade high speed performance.

In copending U.S. application Ser. No. 562,238, entitled "Process For Fabricating High Density Integrated Circuit Array and Product," filed on July 1, 1966 by Barnes et al., now abondoned, an integrated circuit array and the process for making the array are described and claimed wherein a large number of circuits are formed on both faces of the slice. This essentially doubles the number of leads which must extend from the device and materially complicates the problem of packaging the circuit array.

An important object of this invention is to provide a method for packaging multilead semiconductor devices that is less expensive.

Another important object is to provide a method for packaging semiconductor devices having a very large number of external leads.

Yet another object is to provide a method for packaging semiconductor slices having large numbers of circuit arrays fabricated on both sides of the device.

Still another object is to provide an integrated circuit device having a very large number of active components and circuits.

A further object is to provide a method for packaging integrated circuit arrays having circuits formed on both faces of a slice of semiconductor material.

Another object is to provide such a device wherein the external leads may be easily mated with standard circuit board connectors.

Still another object is to provide such a device that is essentially sealed from the ambient.

Still another object of the invention is to provide an integrated circuit device in standard flat pack configuration that may be more economically manufactured.

Another object is to provide an integrated circuit device having an array of circuits which incorporates a heat sink.

A further object is to provide such a device having substantial structural integrity.

Another object of the invention is to provide a multilead semiconductor device which utilizes no ball bonded lead wires and which has a single bonding interface, thus minimizing impedance discontinuities and improving high frequency performance.

These and other objects and advantages are accomplished in accordance with the present invention by adhering a thin conductive layer over the surface of a supporting sheet and over a cavity formed in the surface of the supporting sheet. The conductive layer is then patterned so as to form a plurality of strip leads adhered to the surface of the supporting sheet and extending over the cavity. A semiconductor device is then placed in the cavity and bonding pads on the surface of the semiconductor device placed in contact with the overhanging strip leads.

More specifically, the supporting sheet may comprise a sheet of insulating material, such as standard insulating circuit board, having an opening therethrough. A thin continuous sheet of metal is bonded to the front side of the sheet of insulating material such that the sheet extends over the opening. Both sides of the metal sheet are protected by photo-resist, and the photo-resist is then patterned on one side and the metal sheet etched, such as by conventional photolithographic and etching techniques, to form the lead strips. The integrated circuit chip or slice is then inserted into the opening from the backside and the bonding pads on the surface of the semiconductor body aligned with and bonded to the overhanging lead strips.

In accordance with another aspect of the invention, the lead strips formed on the surface of the insulating sheet may extend to predetermined spaced positions along the the edge of the insulating sheet such that the edge of the insulating sheet may be inserted in a standard printed circuit board connector. Or, the lead strips formed on the surface of the insulating sheet may extend to pins disposed perpendicular to the insulating sheet, the pins being adapted to plug into mating receptacles or sockets. Or, the lead strips may extend beyond the edges of the insulating sheet so as to form a more conventional flat pack configuration. Any one of the structures presently described may be encapsulated in whole or in part in a suitable potting plastic or other potting material to provide protection from the ambient and to provide mechanical stability.

In acordance with still another aspect of the invention, the sheet of insulation may be substantially the same thickness as the semiconductor device so that a stiffening sheet may be bonded to the backside of both the semiconductor device and the insulating sheet to lend further structural rigidity and stability. The stiffening sheet may be metal and a good thermal conductor to serve as a heat sink for the semiconductor device, and if desired, to serve as an electrical ground plane or other electrical function.

The novel features believed characteristic of this invention are set forth in the appended claims. The invention itself, however, as well as other objects and advantages thereof, may best be understood by reference to the following detailed description of illustrative embodiments, when read in conjunction with the accompanying drawings, wherein:

Figure 1:
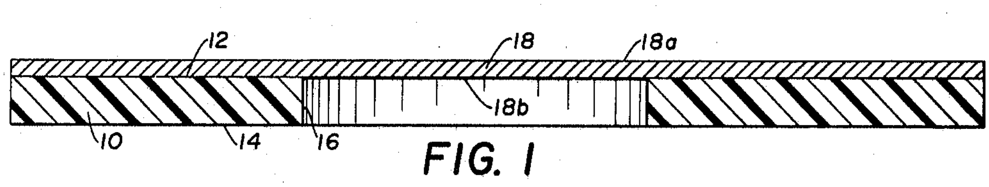
FIGURE 1 is a sectional view illustrating an intermediate step in the process of the present invention.
Figure 2:
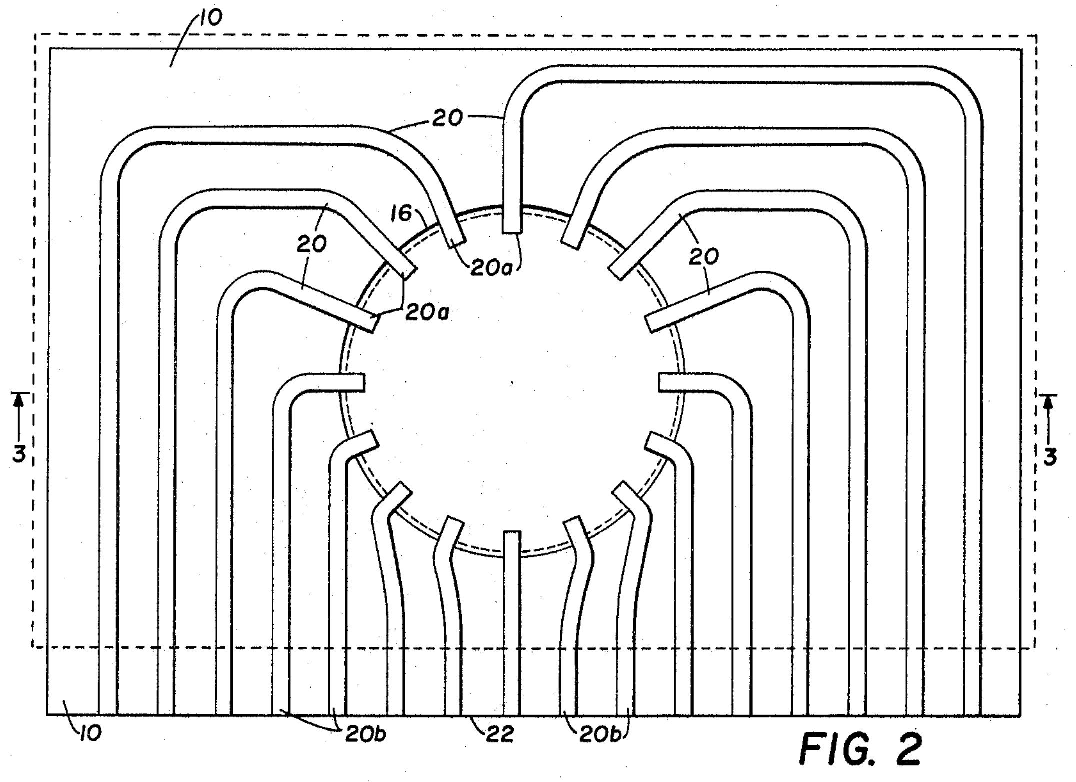
FIGURE 2 is a plan view illustrating another intermediate step in the process of the present invention.
Figure 3:
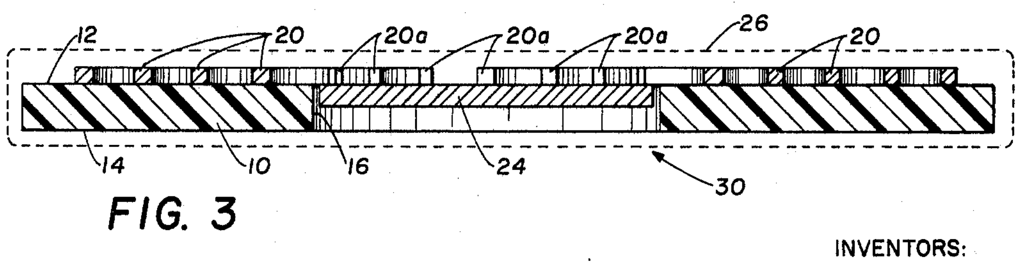
FIGURE 3 is a sectional view similar to FIGURE 1 illustrating still another step in the process of the present invention and a device constructed in accordance with this invention.

The process of the present invention can best be understood in connection with FIGURES 1, 2 and 3. The starting material is a dielectric sheet 10 having surfaces 12 and 14. The dielectric sheet 10 may be formed from substantially any material commonly used for printed circuits, such as epoxy impregnated fiber glass fabric, phenolic printed circuit board, etc. or, if desired, may be a metal sheet with an insulated coating thereon. A cavity is formed in the surface 12 of the dielectric sheet 10 for receiving an integrated circuit device which will presently be described. The cavity is preferably formed by an opening 16 which extends completely through the sheet 10 and which may be formed by punching or any other suitable process.

Next, a continuous conductive sheet 18 is bonded to the surface 12 and extends over the opening 16. The conductive sheet 18 may be any suitable metal, such as copper, and may be bonded to the dielectric sheet 10 using any conventional process such as, for example, the process as used to fabricate printed circuit board stock. The conductive sheet 18 may be coextensive with one or more edges of the dielectric sheet 10, may terminate short of one or more edges, or may extend beyond one or more edges, depending upon the device to be fabricated as will hereafter be described.

The conductive layer 18 is then patterned to form a plurality of lead strips 20, such as illustrated in FIGURES 2 and 3. This may be accomplished by coating both the upper and lower surfaces **18*a* and 18*b* of the sheet 18 with photo resist material. Only the photo resist on the upper surface 18*a* need be exposed to the pattern. When the photo resist is developed, the upper surface 18*a* of the metal layer 18 will then be protected in areas where the metal sheet is to be retained to form strip leads, and is exposed in all areas where it is to be removed. Then the entire assembly is immersed in a suitable selective etchant for the particular metal forming the sheet 18 and the metal is removed in all areas except where protected by the photo resist on the upper surface 18*a*. The photo resist on the lower surface 18*b* limits the etching process to the upper surface. As will be noted in FIGURE 2, the lead strips are formed such that the ends 20*a* extend over the edge of the cavity formed by the opening 16. The other ends 20*b* preferably extend to and terminate at one straight edge 22 of the dielectric sheet 10**.

Next, a semiconductor slice 24 is inserted in the opening 16 from the underside of the dielectric sheet 10 so as not to disturb the ends **20*a* of the strip leads. The semiconductor device 24 may be an entire semiconductor slice, which is nominally about one and one-eighth inches in diameter and about 0.010 inch thick on which an array of many logic circuits may be formed. At this point it should be noted that the drawings are not necessarily to scale, but are merely illustrative of the process of the ultimate device. It should be understood that the number of strip leads 20 may be increased substantially as required. The large number of components such as diodes, transistors, resistors, and capacitors formed in the semiconductor slice are interconnected into circuits and arrays of circuits by one or more layers of conductors fabricated using onventional thin film techniques. However, for each connection that is to be made to a circuit externally of the device 24, a bonding pad is formed on the surface of the device, and the bonding pads are arranged on the slice so that all can be simultaneously aligned with and positioned under the overhanging ends 20*a* of the lead strips 20. After the device 24 is so aligned, the ends 20*a*** of the lead strips are then bonded to the bonding pad using conventional ultrasonic welding or thermocompression welding techniques.

The entire structure is then preferably encapsulated in a suitable potting compound 26 as represented by the dotted outline in FIGURES 2 and 3 to produce a completed device 30. It will be noted that the lower edge of the dielectric sheet 10 and the ends **20*b* of the lead strips remain exposed for connection to external circuitry either by soldering, welding, or by a conventional printed circuit board connector which fits over the edge of the printed circuit board and provides a pressure contact between the ends 20**_b_ and a mating lead.

Figure 4:
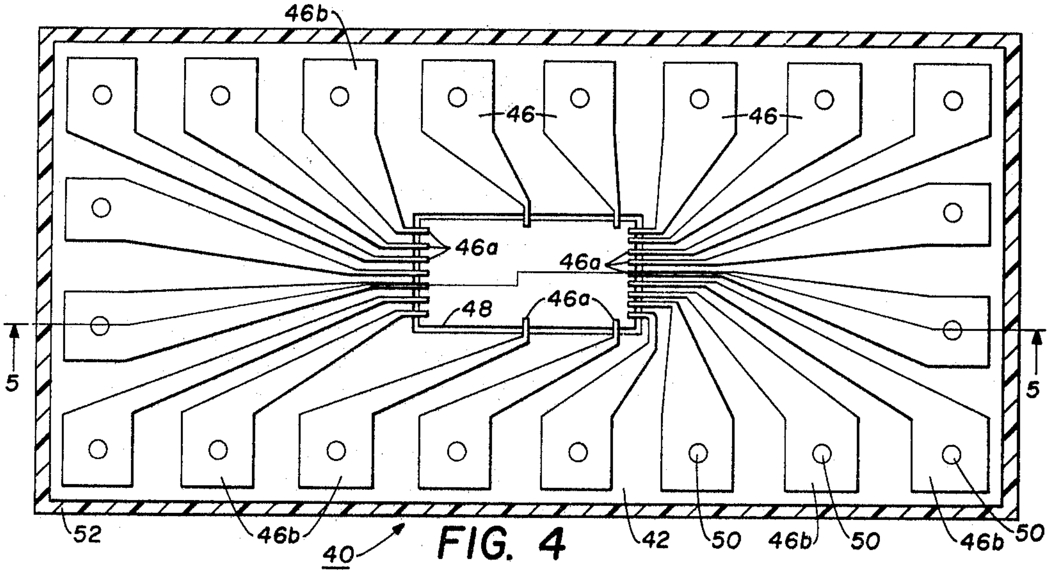
FIGURE 4 is a plan view of another device fabricated in accordance with the process of the present invention at an intermediate stage of fabrication.
Figure 5:
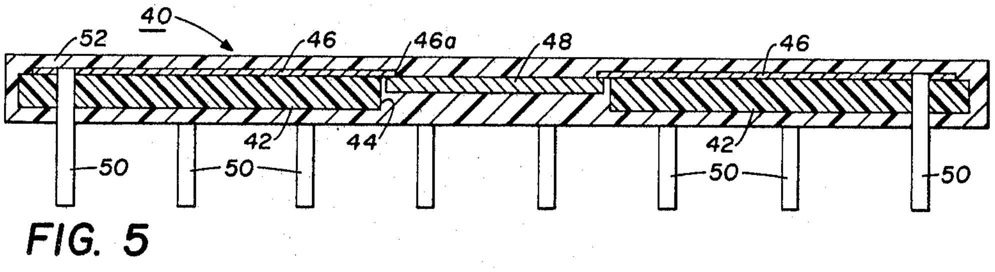
FIGURE 5 is a sectional view taken substantially on lines 5—5 of FIGURE 4.

Another device constructed in accordance with the present invention is indicated generally by the reference numeral 40 in FIGURES 4 and 5. The device 40 has a dielectric sheet 42 with a rectangular opening 44 formed therein. A plurality of strip conductors 46 have ends 46_a_ which overhang the opening 44 and are bonded to bonding pads on the surface of an integrated circuit chip 48 disposed within the opening 44. A conductive pin 50 extends perpendicularly through the other ends 46_b_ of each of the conductor strips 46, through the dielectric sheet 42, and protrudes from the lower face of the device 40. The pins 50 are so sized and spaced as to be plugged into a mating female receptacle. The conductor strips 46, chip 48 and dielectric sheet 42 may then be encapsulated in a suitable potting plastic 52. The device 40 may be fabricated using the same process as that described in connection with fabrication of the device 30 illustrated in FIGURE 3, except of course for the pins 50. The dielectric sheet 42 may typically comprise a thin ceramic sheet into which the pins 50 are inserted using conventional techniques.

Figure 6:
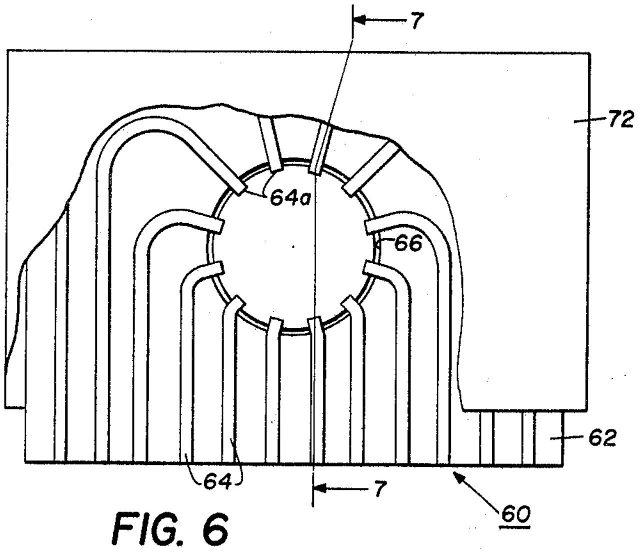
FIGURE 6 is a side view, partially broken away, of still another device fabricated in accordance with the present invention.
Figure 7:
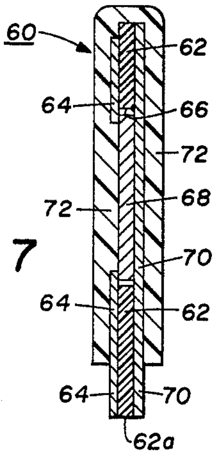
FIGURE 7 is a sectional view taken substantially on lines 7—7 of FIGURE 6.

Another device constructed in accordance with the present invention is indicated generally by the reference numeral 60 in FIGURES 6 and 7. The device 60 is quite similar to the device 30 illustrated in FIGURES 2 and 3 and includes a dielectric sheet 62. A plurality of strip conductors 64 are formed on the upper surface of sheet 62, and the ends 64_a_ overhang an opening 66 formed in the dielectric sheet 62. The ends 64_a_ are bonded to bonding pads on a semiconductor device 68 disposed in the opening 66. However, in the device 60 the dielectric sheet 62 is the same thickness as the semiconductor slice 68, and a stiffening sheet 70 is bonded to the backside of the dielectric sheet 62 and to the backside of the semiconductor slice 68 by a suitable adhesive. The backing sheet 70 lends structural rigidity and stability to the device 60, and is preferably fabricated from metal or other material having good thermal conductivity so as to transfer heat from the semiconductor device 68. Both the strip conductors 64 and the backing sheet 70 may extend to the edge 62_a_ of the dielectric sheet 62. The edge 62_a_ may then be inserted in a suitable connector adapted to provide both electrical and thermal transfer to the lead strips 64 and the backing sheet 70. The entire device may then be encapsulated in a suitable potting plastic 72 except along the edge 62_a_ so as to seal the active portions of the device from the ambient while still permitting electrical and thermal contact to be made through the conductor strip 64 and the backing sheet 70. The backing sheet 70 may be either electrically insulated from or in electrical contact with the semiconductor device 68, as desired, depending upon the type of bonding agent used.

Figure 8:
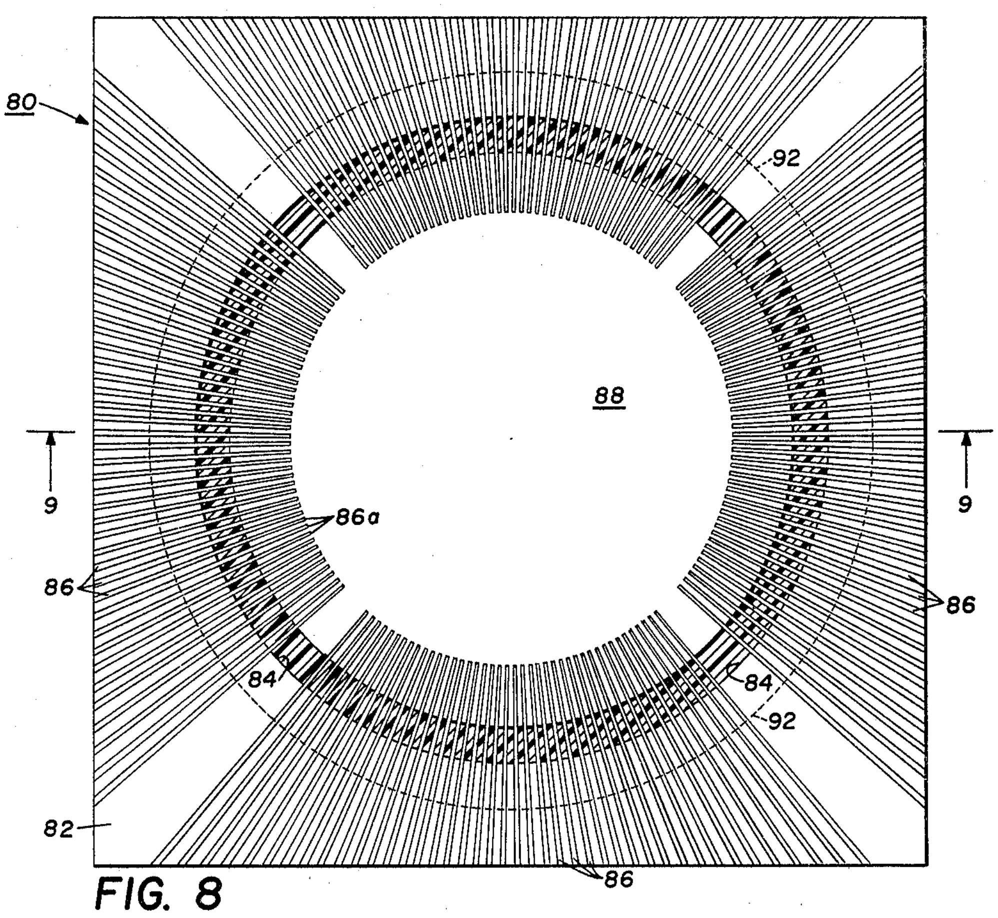
FIGURE 8 is a plan view of still another device constructed in accordance with the present invention, the device being shown at an intermediate stage of fabrication.
Figure 9:
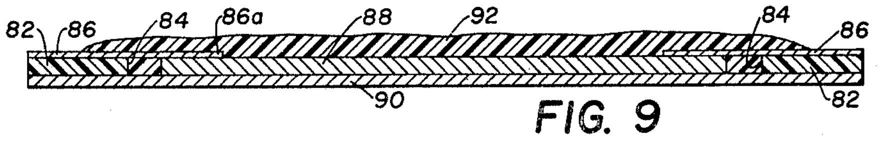
FIGURE 9 is a sectional view taken substantially on lines 9—9 of FIGURE 8, but after completion of the device.

Another device constructed in accordance with the present invention is indicated generally by the reference numeral 80 in FIGURES 8 and 9. The device 80 comprises a dielectric sheet 82 with an aperture 84 formed therein. A large number of lead strips 86 extend from the four edges of the dielectric sheet 82 radially inwardly so that the ends 86_a_ extend over the opening 84 and over a semiconductor slice 88 disposed within the opening 84. The dielectirc sheet 82 and the slice 88 are preferably of substantially the same thickness, and a backing sheet 90 is bonded to the faces of the dielectric sheet 82 and semiconductor slice 88 opposite from the strip leads 86. The backing plate 90 serves to stiffen the structure, and may also be used as a heat tarnsfer media to a heat sink upon which the device is positioned, as well as a ground plane or ground terminal if desired. A suitable potting material 92, such as plastic, is then placed over and around the semiconductor slice 88 by applying the potting material in paste form to the slice 88 and then curing the potting material. Thus, no mold is required in order to encapsulate the slice 88. It should be pointed out that the devices 30, 40 and 60 may also be potted in the same manner without the use of a mold if desired. It will be evident that the device 80 can be fabricated using the process heretofore described.

It will be appreciated by those skilled in the art that although the positions of the circuits on the slice 88, and therefore the positions of the various bonding pads which must be mated with the ends 86_a_ of the lead strips 86, are arranged in a precisely predetermined pattern, the pattern itself is somewhat randomly oriented with respect to the edge of the slice 88. For this reason, the aperture 84 is made somewhat larger than the slice 88 so that the slice 88 may be moved about within the aperture until the bonding pads register with the ends 86_a_ of the strip leads.

Figure 10:
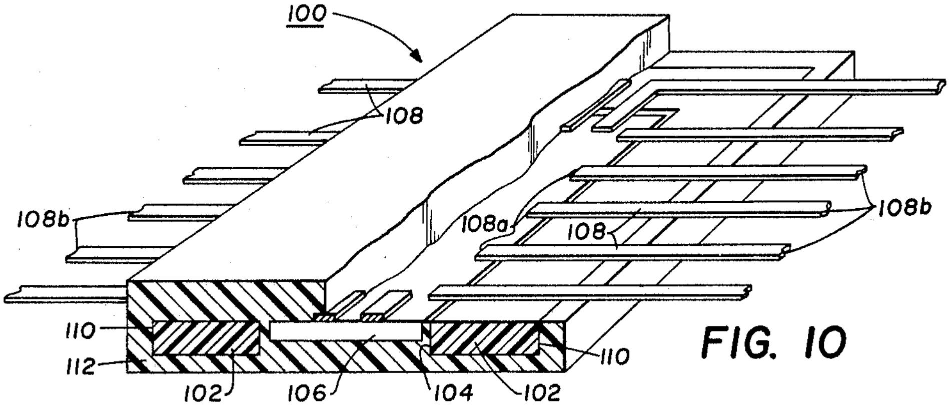
FIGURE 10 is a simplified perspective view of another device constructed in accordance with the present invention, the device being partially broken away to reveal details of construction.

Another device constructed in accordance with the present invention is indicated generally by the reference numeral 100 in FIGURE 10. The device 100 has a size and configuration corresponding to a standard flat pack for an integrated circuit device, such as a single logic element, an amplifier, or the like. In the device 100, a dielectric sheet 102 has an opening 104 for receiving the integrated circuit chip 106. A plurality of strip leads 108 are bonded to the dielectric sheet 102. The inner ends 108_a_ extend over the opening 104 and are bonded to bonding pads on the upper surface of the integrated circuit chip 106. The outer ends 108_b_ of leads 108 extend a considerable distance beyond the outer edge 110 of the dielectric sheet 102. The dielectric sheet 102, integrated circuit chip 106 and a portion of the leads 108 are encapsulated in a suitable potting plastic 112, with the outer ends of the leads 108 protruding from the encapsulating plastic for connection into a circuit external of the device 100.

The device 100 is fabricated in accordance with the present invention by first bonding a metallic sheet to the dielectric sheet 102. The metallic sheet is typically continuous and extends over the opening 104, and is also substantially larger than the dielectric sheet 102 so that it extends beyond the edge 110 of the dielectric sheet 102. The metallic sheet is then patterned using standard photolithographic techniques, care being taken to protect the underside of the sheet with photo resist, to form the leads 108 which project over the opening 104 and beyond the edges 110. The integrated circuit chip 106 is then positioned in the opening 104 by inserting the chip from the lower side of the dielectric sheet 102 to avoid damaging the ends 108_a_, and the ends 108_a_ bonded to bonding pads on the upper surface of the chip 106. The device is then placed in a suitable mold and encapsulated in the plastic 112.

Figure 11:
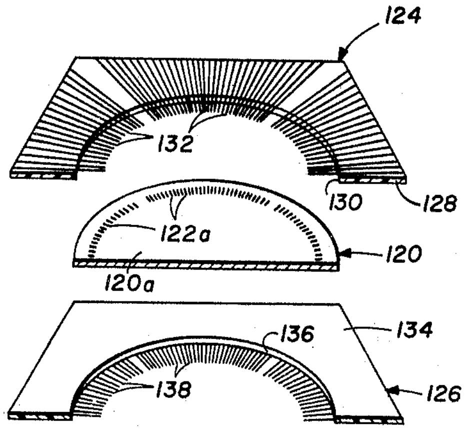
FIGURES 11 and 12 illustrate the method of the present invention as applied to the packaging of a slice having circuits formed on both faces.
Figure 12:
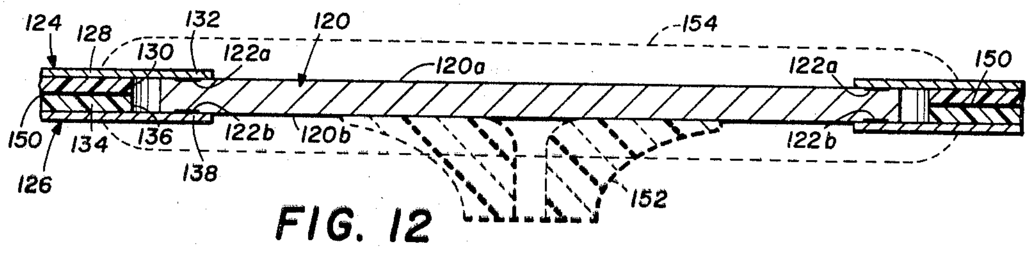

In accordance with another important aspect of the invention, a slice of semiconductor material having circuit arrays formed on both faces in accordance with the above-referenced copending application may be packaged using the method illustrated in FIGURES 11 and 12. A semiconductor slice 120 has circuits formed in the upper and lower faces 120_a_ and 120_b_. Expanded contact pads, represented at 122_a_ and 122_b_, are exposed on the faces 120_a_ and 120_b_, respectively, and are preferably aligned in predetermined relationship. The slice 120 is sandwiched between a pair of package halves indicated generally by the reference numerals 124 and 126. The package half 124 is substantially indentical to the packaging devices heretofore described and comprises an insulating sheet frame 128, which may be a conventional printed circuit board, having an aperture 130 for receiving the slice 120, and a large number of radially extending leads 132 cantilevered over the opening 130. The frame 128 preferably has a thickness equal to about one-half the thickness of the slice 120. The package half 126 is identical to the package half 124 and is comprised of an insulating frame sheet 134 having an opening 136 and radially extending cantilevered leads 138.

To assemble the package, the slice 120 is placed between the package halves 124 and 126, substantially as illustrated in FIGURE 11. It will be noted that the package halves are oriented such that the insulating sheets 128 and 134 are facing the slice 120, with the leads 132 and 138 facing away from the slice. Then the package halves 124 and 126 are brought together as illustrated in FIGURE 12 and aligned so that the leads 132 and 138 will be in the same predetermined relationship as the expended contact pads 122*a* and 122*b* on the slice 120. The package halves may then be bonded together along the abutting faces by a bonding agent represented at 150. The slice 120 can then be manipulated between the leads 132 and 138, such as by a vacuum tool 152 indicated in dotted outline in FIGURE 12, until the contact pads 122*a* are aligned with the ends of the leads 132. The contact pads 122*b* will then be aligned with the leads 138. The leads 132 and 138 can then be welded to the expanded contact pads 122*a* and 122*b*, respectively, using the techniques heretofore described. The slice can then be encapsulated in a suitable epoxy or other material, as represented by the dotted outline 154.

An alternative method for assembling the package is to first mate the package half 124 to the slice 120 by aligning and welding the leads 132 to the contact pads 122*a*. Then the package half 126 is mated with the slice 120 by aligning and welding the leads 138 to the contact pads 122*b*. As before, the slice may then be encapsulated in a suitable epoxy or other material as represented by the dotted outline 154.

Figure 13:
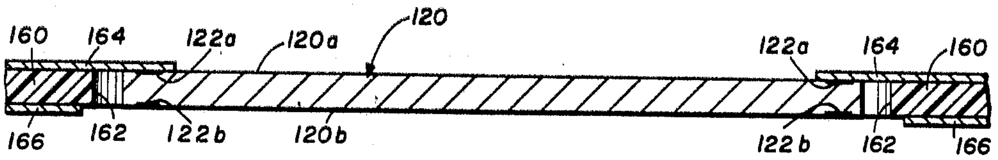
FIGURES 13 and 14 are sectional views illustrating an alternative method for packaging a slice having circuits formed on both faces.
Figure 14:
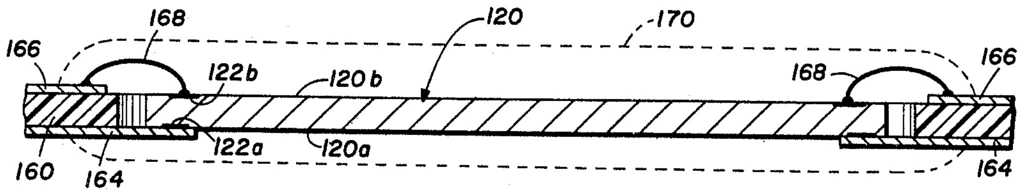

An alternative method for packaging the slice 120 is illustrated in FIGURES 13 and 14. Again, an insulating sheet 160 has an opening 162 therein so that the sheet forms an insulating frame adapted to receive the slice 120. The sheet 160 is preferably as thick as, or slightly thicker than, the slice 120, substantially as illustrated in the drawings. A lead pattern 164, identical to the lead pattern 132, for example, is formed on one surface of the insulating sheet 160, and the same lead pattern 166 is formed on the other surface, except that the leads of the pattern 166 do not extend over the opening 162. This structure may be fabricated by first bonding a metal sheet to the underside of the insulating sheet 160 and patterning the sheet to form the leads 166, then bonding a sheet to the topside of the insulating sheet 160 and patterning the sheet to form the leads 164. Then the leads 164 are again mated with and welded to the contact pads 122*a* as illustrated in FIGURE 13. The assembly may then be inverted and whisker lead wires 168 ball bonded between the contact pads 122*b* and 166. The device may then be encapsulated in epoxy 170, or other suitable material to complete the device.

From the above detailed description, it will be appreciated by those skilled in the art that a highly useful process has been described for packaging integrated circuit arrays and other semiconductor devices requiring a large number of leads. The process is relatively simple and inexpensive and is amenable to use on a mass production basis. The process eliminiates the use of ball bonded lead wire connections, thus simplifying and economizing the process. The number of connections internally of the package is also reduced to one, rather than two as is the case when the bonding pads of the semiconductor device are connected to the external leads by very fine ball bonded jumper wires, thus reducing the number of impedance discontinuities and improving high frequency performance. The devices resulting from the process can be fabricated so as to be compatible with standard printed circuit connectors, with standard multisocket connectors, or with standard flat pack connectors. The number of leads may be very large, one-hundred-fifty leads being readily obtainable. The devices may be fabricated so as to have a good thermal transfer path to remove heat dissipated in the semiconductor device.

Although preferred embodiments of the invention have been described in detail, it is to be understood that various changes, substitutions and alterations can be made therein without departing from the spirit and scope of the invention as defined by the appened claims.

What is claimed is:

1. A multilead package for a multilead electrical dedevice, comprising in combination:

(a) a support member having at least one opening formed therein; and (b) a plurality of spaced conductive ribbons secured to one surface of said support member; wherein (c) said opening has a periphery that is relatively smaller than the periphery of said support member; and wherein (d) at least some of said conductive ribbons have one end that overlaps the periphery of said opening and extends partially into said opening, and an opposite end that terminates in close proximity to the periphery of said support; and wherein (e) the space between the centers of said one ends of any two adjacent conductive ribbons is relatively smaller than the space between the centers of the opposite ends of said two adjacent conductive ribbons; and (f) a multilead electrical device positioned at least partially within said opening with conductors on one surface of said device selectively engaging said one ends of said conductive ribbons and electrically connecting selective portions of said electrical device through respective conductive ribbons to electrical points on said one surface of said support member in close proximity to the periphery thereof.

2. The multilead package of claim 1 wherein:

(a) the periphery of said support has at least one substantially straight edge; and wherein (b) said conductive ribbons extend from the periphery of said opening to said one straight edge.

3. The multilead package of claim 1 wherein:

(a) said opening is polygonally shaped; and wherein (b) the width of said opposite ends of said conductive ribbons is relatively larger than the width of said one ends of said conductive ribbons.

4. The multilead package of claim 3 and further including a plurality of transversely extending, conductive pins electrically connected to said opposite ends of said conductive ribbons.

5. The multilead package of claim 1 and further including a sheet of thermally conductive material secured to the other surface of said support member and to said electrical device for providing structural rigidity and stability to said package and for transferring heat from said electrical device.

6. The multilead package of claim 1 wherein said conductive ribbons are substantially straight, relatively narrow strips of conductive material radially extending from said opening.

7. The multilead package of claim 1 and further including:

(a) a second support member having at least one opening formed therein and a second plurality of conductive ribbons secured to one surface of said second support member; wherein (b) said second support member and its opening and said second plurality of conductive ribbons are substantially the same as said first mentioned support member and its opening and said first mentioned plurality of conductive ribbons; and wherein (c) said electrical device is positioned partially within both of said one openings of said first and second support members, and conductors on two surfaces of said device selectively engage said one ends of said first and second plurality of conductive ribbons and electrically connect selective portions of said electrical device through respective conductive ribbons to electrical points on each of said one surfaces in close proximity to the periphery of said support member.

8. The multilead package of claim 1 wherein said electrical device and at least a portion of said support member and contiguous conductive ribbons are encapsulated in a potting compound.

References Cited

UNITED STATES PATENTS

| | | | |
|---|---|---|---|
| 3,011,379 | 12/1961 | Corwin. | |
| 3,142,783 | 7/1964 | Warren. | |
| 3,176,191 | 3/1965 | Rowe | 29—626 XR |
| 3,192,307 | 6/1965 | Lazar | 174—68.5 |
| 3,325,882 | 6/1967 | Chiou et al. | |
| 3,374,533 | 3/1968 | Burks et al. | |
| 3,390,308 | 6/1968 | Marley. | |

FOREIGN PATENTS

| | | |
|---|---|---|
| 1,099,888 | 3/1955 | France. |

DARRELL L. CLAY, Primary Examiner

U.S. Cl. X.R.

29—626, 627; 156—3; 317—101, 234